United States Patent
Yoshikawa et al.

(10) Patent No.: US 6,870,199 B1
(45) Date of Patent: Mar. 22, 2005

(54) SEMICONDUCTOR DEVICE HAVING AN ELECTRODE OVERLAPS A SHORT CARRIER LIFETIME REGION

(75) Inventors: Ko Yoshikawa, Nagano (JP); Michio Nemoto, Nagano (JP); Takeshi Fujii, Nagano (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 09/705,648

(22) Filed: Nov. 3, 2000

(30) Foreign Application Priority Data

Nov. 5, 1999 (JP) .......................................... 11-315427

(51) Int. Cl.⁷ ........................ H01L 29/74; H01L 21/322
(52) U.S. Cl. ...................... 257/131; 257/156; 257/612; 257/656; 438/133; 438/140; 438/378; 438/798
(58) Field of Search ................................ 257/107, 156, 257/173, 174, 129, 130, 131, 155, 612, 656; 438/133, 140, 378, 798

(56) References Cited

U.S. PATENT DOCUMENTS

| | | | | |
|---|---|---|---|---|
| 3,988,771 A | * | 10/1976 | Krishna .................... | 257/156 |
| 3,988,772 A | * | 10/1976 | Krishna .................... | 257/121 |
| 4,165,517 A | * | 8/1979 | Temple et al. ............. | 257/173 |
| 4,567,430 A | * | 1/1986 | Carr ........................... | 324/765 |
| 4,811,072 A | * | 3/1989 | Risberg ...................... | 257/133 |
| 4,963,509 A | * | 10/1990 | Yoshizawa et al. ........ | 438/543 |
| 5,181,083 A | * | 1/1993 | Pezzani ...................... | 257/491 |
| 5,210,601 A | * | 5/1993 | Kitagawa et al. .......... | 257/727 |
| 5,243,205 A | * | 9/1993 | Kitagawa et al. .......... | 257/173 |
| 5,360,990 A | * | 11/1994 | Swanson .................... | 257/656 |
| 5,747,371 A | | 5/1998 | Robb et al. | |
| 6,168,981 B1 | * | 1/2001 | Battaglia et al. ............ | 438/164 |
| 6,627,961 B1 | * | 9/2003 | Francis et al. .............. | 257/378 |

FOREIGN PATENT DOCUMENTS

| | | |
|---|---|---|
| DE | 41 35 258 A | 4/1993 |
| EP | 1 014 453 A | 6/2000 |
| EP | 1 098 371 A3 | 6/2003 |
| JP | 04-017372 A | 1/1992 |
| JP | 07-297414 | 11/1995 |
| JP | 9-36388 | 2/1997 |
| WO | 99 09600 A | 2/1999 |

OTHER PUBLICATIONS

E. Napoli et al., Power PIN Diode Performance Improvement through Local Lifetime Control: Numerical Analysis. IEEE 1998, pp. 49–54.*

(List continued on next page.)

Primary Examiner—Anh Duy Mai
(74) Attorney, Agent, or Firm—Rossi & Associates

(57) ABSTRACT

A semiconductor device that helps to prevent the occurrence of current localization in the vicinity of an electrode edge and improves the reverse-recovery withstanding capability. The semiconductor device according to the invention includes a first carrier lifetime region, in which the carrier lifetime is short, formed in such a configuration that the first carrier lifetime region extends across the edge area of an anode electrode projection, which projects the anode electrode vertically into a semiconductor substrate. The first carrier lifetime region also includes a vertical boundary area spreading nearly vertically between a heavily doped p-type anode layer and a lightly doped semiconductor layer. The first carrier lifetime region of the invention is formed by irradiating with a particle beam, such as a $He^{2+}$ ion beam or a proton beam.

28 Claims, 9 Drawing Sheets

OTHER PUBLICATIONS

S.H. Larry Tu et al., Optimization of the MPS Rectifier via Variation of Schottky Region Area. IEEE 1991, pp. 109–112.*

M.T. Rahimo et al., A Novel Concept for Fast Recovery Diodes having Junction Charge Extraction (JCE) Regions. ISPSD 1998, pp. 309–312.*

J. Vobecky et al. Future Trends in Local Lifetime Control. IEEE 1996, pp. 161–164.*

Kushida, et al., "A He–Irradiated IGBT with a shallow p–base and shallow FLRs", Power Semiconductor Devices And IC's, 1997, ISPSD '97., 1997 IEEE International Symposium On Weimar, Germany May 26–29, 1997; New York, NY, USA, IEEE, US, May 26, 1997, pp. 277–280.

* cited by examiner

Relation between $He^{2+}$ ion amount of dose and $dI/dt$ withstanding capability Relation between $He^{2+}$ ion amount of dose and forward voltage Relation between the width Lb and dI/dt withstanding capability Relation between the width La and dI/dt withstanding capability Relation between the depth (Da-Xj) and dI/dt withstanding capability

CURRENT DENSITY DISTRIBUTION

CURRENT DENSITY DISTRIBUTION

CURRENT DENSITY DISTRIBUTION

SEMICONDUCTOR DEVICE HAVING AN ELECTRODE OVERLAPS A SHORT CARRIER LIFETIME REGION

FIELD OF THE INVENTION

The present invention relates to a semiconductor device that facilitates the prevention of reverse recovery breakdown. Specifically, the present invention relates to a semiconductor structure that facilitates relaxing current localization to the vicinity of the electrode of a diode and to a semiconductor device which exhibits a rectifying function. The invention also relates to the method of manufacturing the semiconductor device.

DESCRIPTION OF RELATED ART

Recent achievements for the power semiconductor devices include such things as loss reduction, increased switching speed, reduced inductance in peripheral circuits, and eliminating the need for a snubber circuit. In association with these achievements, however, it is also desirable to improve the reverse recovery characteristics of the diode (freewheel diode: FWD) used in combination with power switching devices, such as reverse-recovery withstanding capability, reverse recovery loss, and soft switching function.

In particular, the change of reverse recovery current with time dI/dt, which is closely related with the reverse-recovery withstanding capability, has been increased year by year. Because of this, it is desirable to improve withstanding capability against dI/dt (hereinafter referred to as the "dI/dt withstanding capability").

FIG. 17 is a cross sectional view of a conventional fundamental p-i-n diode. Referring to FIG. 17, a p-type anode layer 2 is on a first major surface of an n-type semiconductor substrate 1, and an n-type cathode layer 3 is on a second major surface of n-type semiconductor substrate 1. When a forward bias voltage is applied to the diode of FIG. 17 (a positive voltage to p-type anode layer 2 and a negative voltage to n-type cathode layer 3), and when the forward voltage across the pn-junction between p-type anode layer 2 and n-type semiconductor substrate 1 exceeds about 0.6 V (for example, in the case wherein the semiconductor is silicon), holes are injected from p-type anode layer 2 to n-type semiconductor substrate 1, and electrons are injected from n-type cathode layer 3 to n-type semiconductor substrate 1. In this way, a condition of electrical neutrality may be established. (Hereinafter, the electrons and the holes accumulated excessively in semiconductor substrate 1 will be referred to as the "accumulated carries".) As a result, a conductivity modulation is caused in semiconductor substrate 1, and the resistance of semiconductor substrate 1 becomes extremely small, such that semiconductor substrate 1 becomes conductive.

Although the anode electrode is formed on a portion of the first major surface, no structure for bearing the breakdown voltage (hereinafter referred to as a "breakdown withstanding structure") is formed underneath it, and the cathode electrode is formed on the entire second major surface. Due to this, accumulated carries exist below the breakdown withstanding structure.

There exists a reverse recovery step during the transition, through which the forward bias state shifts to a reverse bias state. The reverse recovery is a phenomenon in that the carries, excessively accumulated by the forward bias voltage application, keep flowing in the reverse direction (a short circuit state) in a short period of time when a reverse bias voltage is applied until the excessively accumulated carries vanish.

The reverse recovery breakdown usually occurs in the boundary region between the active region and the breakdown withstanding structure region of the diode. The reverse recovery breakdown is a thermal breakdown caused by electric field localization and current localization to the boundary region. The electric field localization is caused by a cylindrical or spherical pn-junction formed in the edge area of the anode region. Current localization is caused by the flow of accumulated carries, accumulated below the breakdown withstanding structure, to the anode electrode during reverse recovery.

Countermeasures according to the prior art include preventing electric field localization by deepening the pn-junction in the edge area of the anode region and separating the region. In this way, electric field localization is caused, and in the region, current localization is caused. By positioning the portion in this way, the anode electrode and the anode region contact each other away from the edge area of the anode region. However, this countermeasure is not fully effective to improve reverse-recovery withstanding capability, because current localization is not prevented from occurring.

In view of the foregoing, it is an object of the invention to provide a semiconductor device including a simple means to held prevent current localization from occurring in the vicinity of the electrode thereof, thereby significantly improving reverse-recovery withstanding capability.

SUMMARY OF THE INVENTION

According to one aspect of the invention, there is provided a semiconductor device formed of (1) a semiconductor substrate, the semiconductor substrate being a lightly doped layer of a first conductivity type, (2) a heavily doped region of a second conductivity type in the lightly doped layer, and (3) an electrode on the semiconductor substrate, the electrode contacting with the heavily doped region of the second conductivity type. The semiconductor substrate includes a first carrier lifetime region and a second carrier lifetime region, with the carrier lifetime in the first carrier lifetime region being shorter than the carrier lifetime in the second carrier lifetime region. The first carrier lifetime region extends across the edge area of an electrode projection, which projects the electrode vertically into the semiconductor substrate. The first carrier lifetime region includes a boundary area spreading nearly vertically between the heavily doped region of the second conductivity type and the lightly doped layer of the first conductivity type.

In a particularly preferred embodiment of the invention, the first carrier lifetime region extends across the outermost edge area of the electrode projecting the electrode vertically into the semiconductor substrate, near to the edge area of the semiconductor device. Even more preferably, the first carrier lifetime region extends perpendicular to the substrate surface having the electrode formed thereon.

In another preferred embodiment, (1) the depth Da of the first carrier lifetime region from the surface of the substrate, on the side on which the heavily doped region of the second conductivity type is formed, (2) the diffusion length Ls of the carriers in the first carrier lifetime region, and (3) the depth Xj of the pn-junction between the heavily doped region of the second conductivity type and the lightly doped layer of the first conductivity type, are all related to each other by the following relational expression:

$$Da > Ls + Xj$$

Advantageously, the width La of the first carrier lifetime region, over which the electrode is overlapping, and the diffusion length Ls of the carriers in the first carrier lifetime region, are related to each other by the following relational expression:

$$La > Ls$$

Even more preferably, the width Lb of the first carrier lifetime region, over which the electrode is not overlapping, and the diffusion length Lh of the carriers in the second carrier lifetime region, are related to each other by the following relational expression:

$$Lb > Lh$$

According to another aspect of the invention, there is provided a method of manufacturing a semiconductor device including (1) a semiconductor substrate, the semiconductor substrate being a lightly doped layer of a first conductivity type; (2) a heavily doped region of a second conductivity type formed selectively in the lightly doped layer; and (3) an electrode on the semiconductor substrate, the electrode being in contact with the heavily doped region of the second conductivity type. The semiconductor substrate includes a first carrier lifetime region and a second carrier lifetime region, the carrier lifetime in the first carrier lifetime region being shorter than the carrier lifetime in the second carrier lifetime region; the first carrier lifetime region extending across the edge area of the electrode projection, projecting the electrode vertically into the semiconductor substrate; the first carrier lifetime region including the boundary area spreading almost vertically between the heavily doped region of the second conductivity type and the lightly doped layer of the first conductivity type. The method of the invention includes the step of irradiating with a particle beam to form the first carrier lifetime region.

In a particularly preferred embodiment, the particle beam is irradiated onto the surface of the semiconductor substrate on the side on which the electrode is formed. Advantageously, the particle beam includes $He^{2+}$ ions or protons. It is also preferred that $He^{2+}$ ions are irradiated at the amount of dose of about $1 \times 10^{10}$ $cm^{-2}$ or more.

Preferably, the carrier lifetime in the first carrier lifetime region is ⅓ or less of the carrier lifetime in the second carrier lifetime region. It is also preferred that the semiconductor device be a diode, with the heavily doped region of the second conductivity type being an anode layer, and the electrode being an anode electrode.

BRIEF DESCRIPTION OF THE DRAWINGS

The accompanying drawings, which are incorporated in and constitute a part of the specification, illustrate presently preferred embodiments of the invention and, together with the general description provided above and the detailed description given below, serve to explain the principles of the invention.

DETAILED DESCRIPTION OF THE PREFERRED EMBODIMENTS

First Embodiment of the Invention

Figure 1:
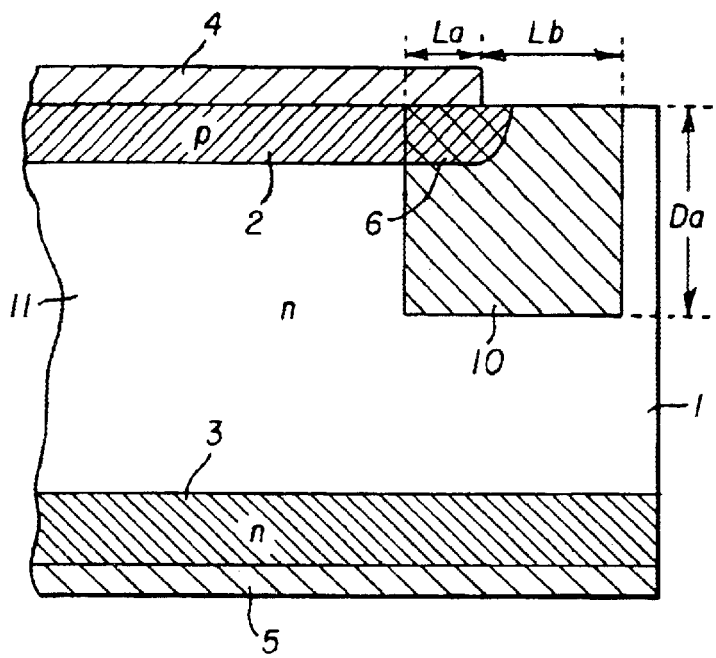
FIG. 1 shows a cross sectional view of a p-i-n diode according to a first embodiment of the invention.

The first embodiment of the invention will be explained with reference to FIGS. 1 through 6. Referring to FIG. 1, an n-type semiconductor substrate 1 is formed as a lightly doped semiconductor layer. A p-type anode layer 2 is formed as a heavily doped conductive region selectively on a first major surface of n-type semiconductor substrate 1. An n-type cathode layer 3 is formed as another heavily doped conductive region on a second major surface of n-type semiconductor substrate 1.

A metal anode electrode 4 is formed on p-type anode layer 2. The edge area of anode electrode 4 is spaced apart for 10 micrometers inward from the edge area of type anode layer 2. A cathode electrode 5 is formed on the entire surface of n-type cathode layer 3.

A first carrier lifetime region 10 and a second carrier lifetime region 11 are formed in n-type semiconductor substrate 1, so that the diode according to the first embodiment may exhibit two carrier lifetimes. First carrier lifetime region 10 extends across the edge area of anode electrode 4 on a projection that projects anode electrode 4 vertically into n-type semiconductor substrate 1 and includes a boundary area 6 spreading almost vertically between p-type anode layer 2 and the lightly doped layer of n-type semiconductor substrate 1. The remaining region of n-type semiconductor substrate 1, which is not assigned to first carrier lifetime region (short-carrier-lifetime region) 10, is second carrier lifetime region 11, in which the carrier lifetime is longer.

The dimensions of first carrier lifetime region 10, in which the carrier lifetime is shorter, are described as follows. The width of region 10, over which anode electrode 4 is overlapping, is represented by La. The width of region 10, over which anode electrode 4 does not overlap, is represented by Lb. The depth of region 10 from the surface of semiconductor substrate 1 on the side, on which p-type anode layer 2 is formed, is represented by Da. In the diode according to the first embodiment, La=about 50 micrometers, Lb=about 2400 micrometers, and Da=about 30 micrometers. The dimensions of first carrier lifetime region 10 is not limited to those described above.

In the diode according to the first embodiment, the resistivity of n-type semiconductor substrate 1 is about 300 ohm-cms. The thickness of n-type semiconductor substrate 1 is 550 micrometers. The surface impurity concentration of p-type anode layer 2 is about $3.0 \times 10^{16}$ cm$^{-3}$. The diffusion depth of p-type anode layer 2 is about 5.0 micrometers. The surface impurity concentration of n-type cathode layer 3 is $1.0 \times 10^{20}$ cm$^{-3}$. The diffusion depth of n-type cathode layer 3 is about 80.0 micrometers.

The method of manufacturing the semiconductor device according to the first embodiment of the invention will now be described. In manufacturing the semiconductor substrate of the diode according to the first embodiment, the manufacturing steps are controlled so that the semiconductor substrate exhibits two carrier lifetimes. Region 10, in which the carrier lifetime is short, is formed such that region 10 extends across the edge area of anode electrode 4 and includes boundary area 6 below the edge area of anode electrode 4.

Region 10, in which the carrier lifetime is short, is easily formed by using particle beam irradiation, such as He$^{2+}$ ion irradiation or proton ion irradiation, to introduce crystal defects. A mask, having a window corresponding to the region in which the carrier lifetime is to be short, is fabricated using a material, such as aluminum metal or a thick resist film, that is capable of blocking He$^{2+}$ ions and protons. The mask is positioned such that a portion of the mask is on the surface of type anode layer 2 and a portion is in contact with the exposed surface portion of n-type semiconductor substrate 1. He$^{2+}$ ions or protons are irradiated vertically onto the masked area.

Since He$^{2+}$ ions and protons exhibit respective ranges corresponding to the acceleration voltage, only the unmasked window portion of n-type semiconductor substrate 1 is irradiated, assuming that the mask is sufficiently thick. Thus, crystal defects are introduced into the unmasked portion of n-type semiconductor substrate 1. The region of n-type semiconductor substrate 1 into which crystal defects are introduced is region 10, and in that region, the carrier lifetime is short.

When n-type semiconductor substrate 1 is thick, crystal defects may be introduced by irradiating multiple times, changing the irradiation depth each time. Crystal defects may also be introduced by setting an irradiation depth greater than the thickness of the semiconductor substrate and by transmitting He$^{2+}$ ions or protons through n-type semiconductor substrate 1.

The carrier lifetime in the region in which the carrier lifetime is long is adjusted by adjusting the average carrier lifetime in the semiconductor substrate. The average carrier lifetime in the semiconductor substrate can be adjusted by irradiating with an electron beam or by diffusing with a heavy metal using the above-described ion irradiation methods.

Preferably, first carrier lifetime region 10, in which the carrier lifetime is short, is formed by irradiating He$^{2+}$ ions using a resist film of 50 micrometers in thickness as a mask (followed by subsequent heat treatment). Second carrier lifetime region 11, in which the carrier lifetime is long, is formed by irradiating electron beams (followed by subsequent heat treatment). The carrier lifetime is varied by changing the amount of the dose of He$^{2+}$ ion from about 0 (no irradiation) to about $1.0 \times 10^{12}$ cm$^{-2}$.

Figure 2:
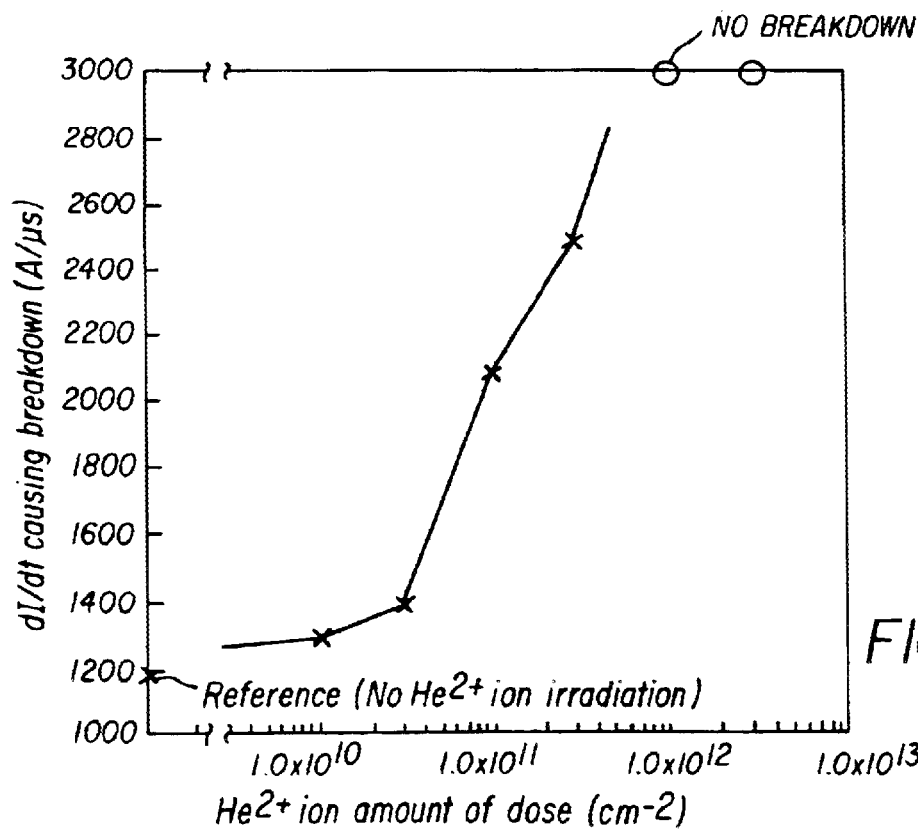
FIG. 2 is a graph describing the relationship between the dose of $He^{+2}$ ion and the dI/dt withstanding capability of a p-i-n diode exhibiting a breakdown voltage of the 4500 V class.

The investigations conducted on the p-i-n diode exhibiting a breakdown voltage of the 4500 V class according to the first embodiment will now be described with reference to FIGS. 2 and 3. FIG. 2 is a graph describing the relationship between the amount of the dose of He$^{2+}$ ion and the withstanding capability against change of the reverse recovery current with time dI/dt (the dI/dt withstanding capability) of the p-i-n diode exhibiting a breakdown voltage of the 4500 V class. The carrier lifetime in second carrier lifetime region 11, in which the carrier lifetime is long, is 5 microseconds, and the carrier diffusion length is about 100 micrometers. The other conditions for the reverse recovery test include a forward current of about 170 A/cm$^2$, a DC voltage of about 2600 V, and a junction temperature of about 125° C.

The dI/dt withstanding capability is improved by forming region 10, in which the carrier lifetime is short, such that region 10 extends across the edge area of anode electrode 4 and includes boundary area 6. As FIG. 2 indicates, the dI/dt withstanding capability is improved effectively by a He$^{2+}$ ion dose in the amount of $1.0 \times 10^{10}$ cm$^{-2}$, and even more effectively by a He$^{2+}$ ion dose in the amount of $1.0 \times 10^{11}$ cm$^{-2}$ or more. When the He$^{2+}$ ion dose is about $1.0 \times 10^{10}$ cm$^{-2}$, the carrier lifetime in first carrier lifetime region 10, in which the carrier lifetime is short, is about 1.5 microseconds and the carrier diffusion length is about 60 micrometers. When the carrier lifetime in first carrier lifetime region 10 (for example, about 1.5 microseconds) is about ⅓ or less of the carrier lifetime in second carrier lifetime region (long-carrier-lifetime region, which functions as a semiconductor layer) 11 (for example, about 5.0 microseconds), the dI/dt withstanding capability increases remarkably.

Figure 3:
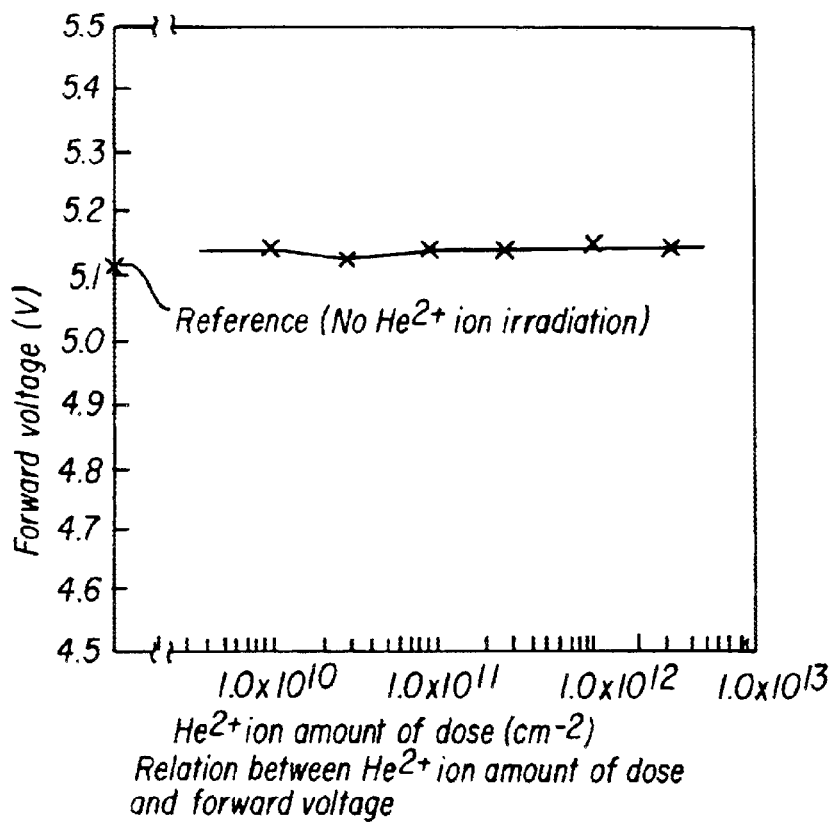
FIG. 3 is a graph describing the relationship between the dose of $He^{+2}$ ion and the forward voltage of a p-i-n diode exhibiting a breakdown voltage of the 4500 V class.

FIG. 3 is a graph describing the relationship between the amount of the He$^{2+}$ ion dose and the forward voltage of the p-i-n diode exhibiting a breakdown voltage of the 4500 V class. As FIG. 3 indicates, the He$^{2+}$ ion irradiation has a negligible effect on the forward voltage, since the active region, onto which He$^{2+}$ ions are irradiated and in which the diode operation is conducted, occupies only about 1% of the area.

Figure 4:
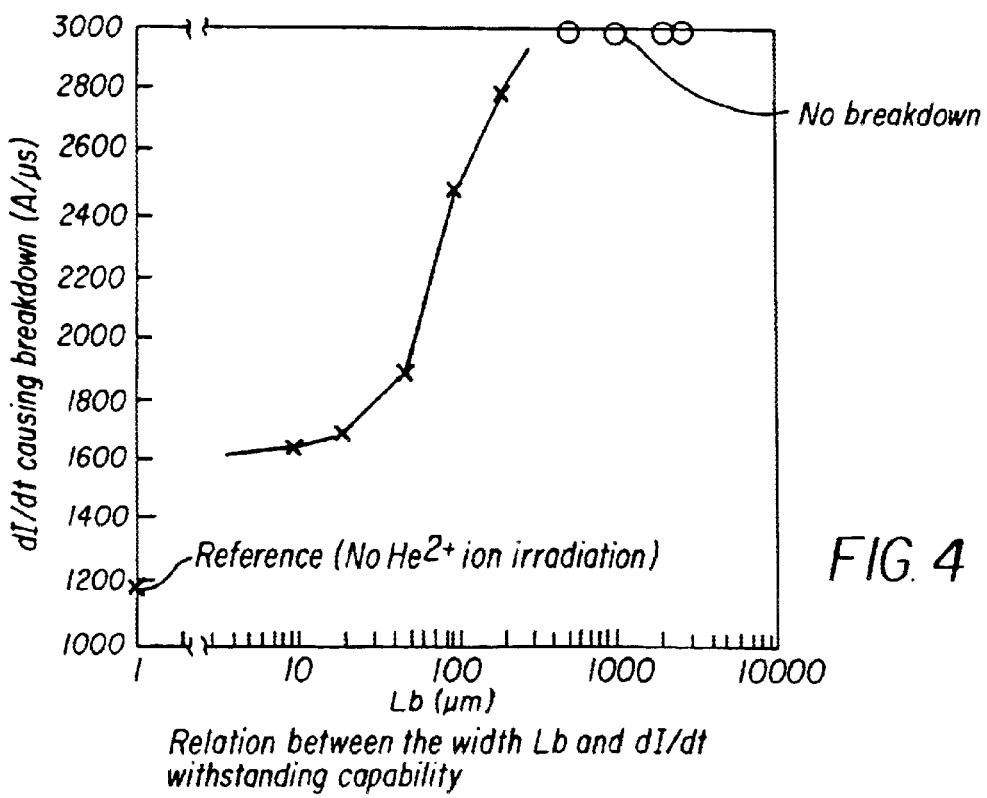
FIG. 4 is a graph describing the relationship between the width Lb of the first carrier lifetime region, over which the anode electrode does not overlap, and the dI/dt withstanding capability of a p-i-n diode exhibiting a breakdown voltage of the 4500 V class.
Figure 5:
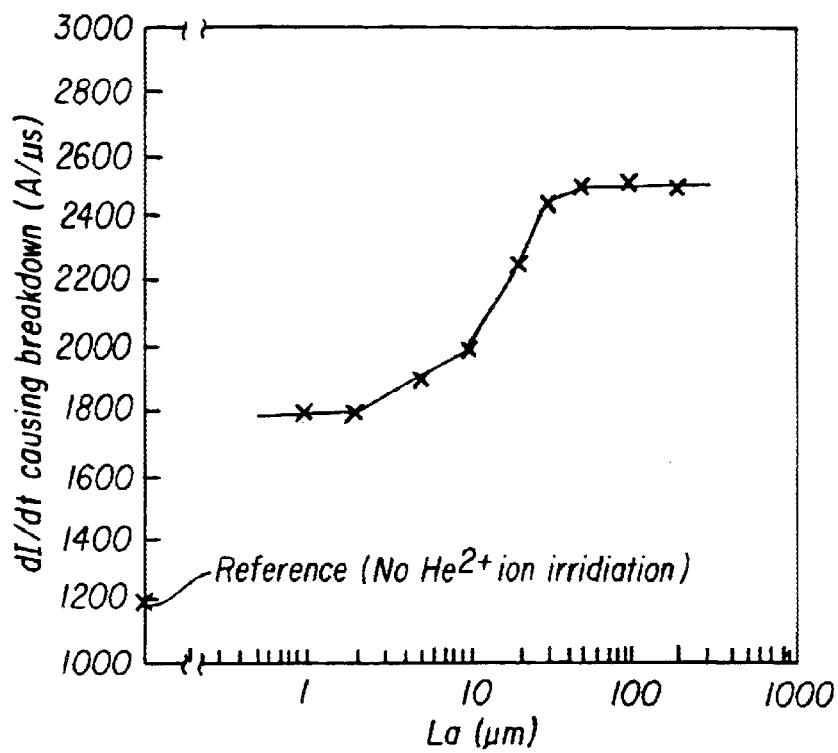
FIG. 5 is a graph describing the relationship between La and the dI/dt withstanding capability of a p-i-n diode exhibiting a breakdown voltage of the 4500 V class.
Figure 6:
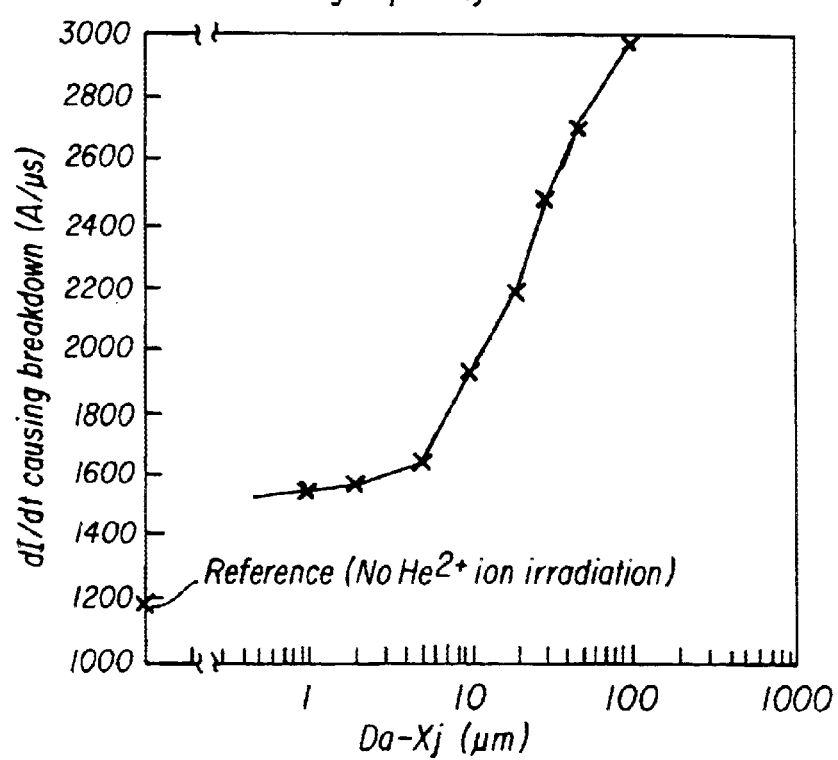
FIG. 6 is a graph describing the relationship between the net depth of the first carrier lifetime region (Da) and the dI/dt withstanding capability of a p-i-n diode exhibiting a breakdown voltage of the 4500 V class.

The relationships between the parameters of the p-i-n diode according to the first embodiment will now be described with reference to FIGS. 4 through 6. FIGS. 4 through 6 show the results of investigations conducted by changing the location of He$^{2+}$ ion irradiation in a p-i-n diode exhibiting a breakdown voltage of the 4500 V class.

FIG. 4 is a graph describing the relationship between the width Lb of the first carrier lifetime region (which the anode electrode does not overlap) and the dI/dt withstanding capability of a p-i-n diode exhibiting a breakdown voltage of the 4500 V class, where the width La of the first carrier lifetime region (which the anode electrode overlaps) is about 50 micrometers, the depth Da of the first carrier lifetime region from the surface of the semiconductor substrate on the side on which the p-type anode layer is formed is about 30 micrometers, and the amount of the $He^{2+}$ ion dose is about $1.0 \times 10^{12}$ $cm^{-2}$.

The carrier diffusion length Lh in second carrier lifetime region 11 (in which the carrier lifetime is longer) is about 100 micrometers, and the carrier diffusion length in first carrier lifetime region 10 (in which the carrier lifetime is short) is about 15 micrometers. The dI/dt withstanding capability of the p-i-n diode starts increasing drastically from around the width Lb, which is equal to the carrier diffusion length Lh in second carrier lifetime region 11. In other words, a sufficiently high dI/dt withstanding capability is obtained when the width Lb and the carrier diffusion length Lh in second carrier lifetime region 11 are related by the following relational expression:

$Lb > Lh$

FIG. 5 is a graph describing the relationship between La and the dI/dt withstanding capability of the p-i-n diode exhibiting a breakdown voltage of the 4500 V class, at an Lb of about 200 micrometers, a Da of about 30 micrometers, and an $He^{2+}$ ion dose in the amount of about of $1.0 \times 10^{12}$ $cm^{-2}$. The carrier diffusion length in second carrier lifetime region 11 is about 100 micrometers, and the carrier diffusion length Ls in first carrier lifetime region 10 is about 15 micrometers. The dI/dt withstanding capability of the p-i-n diode starts increasing drastically from around the width La, which is equal to the carrier diffusion length Ls in first carrier lifetime region 10. In other words, a significantly higher dI/dt withstanding capability is obtained when the width La and the carrier diffusion length Ls in first carrier lifetime region 10 are related by the following relational expression:

$La > Ls$

FIG. 6 is a graph describing the relationship between the net depth (Da−Xj) of first carrier lifetime region 10 and the dI/dt withstanding capability of a p-i-n diode exhibiting a breakdown voltage of the 4500 V class, where La is about 100 micrometers, Lb is about 100 micrometers, and the $He^{2+}$ ion dose is in the amount of about of $1.0 \times 10^{12}$ $cm^{-2}$. Here, Xj is the depth of the pn-junction between p-type anode layer 2 and n-type semiconductor substrate 1. In this first embodiment, the junction depth Xj is preferably about 5 micrometers, which is the diffusion depth of p-type anode layer 2.

The carrier diffusion length in second carrier lifetime region 11 is about 100 micrometers, and the carrier diffusion length in the first carrier lifetime region is about 15 micrometers. The dI/dt withstanding capability of the p-i-n diode starts increasing drastically from around the net depth (Da−Xj), which is equal to the carrier diffusion length in first carrier lifetime region 10. In other words, a significantly higher dI/dt withstanding capability is obtained when the net depth (Da−Xj) and the carrier diffusion length Ls in first carrier lifetime region 10 are related by the following relational expression:

$Da - Xj > Ls$

Second Embodiment of the Invention

A second preferred embodiment of the invention will now be explained with reference to FIGS. 7 through 13. In FIGS. 7 through 13, the same reference numerals as used in FIGS. 1 through 6 are used to identify the same constituent elements.

Figure 7:
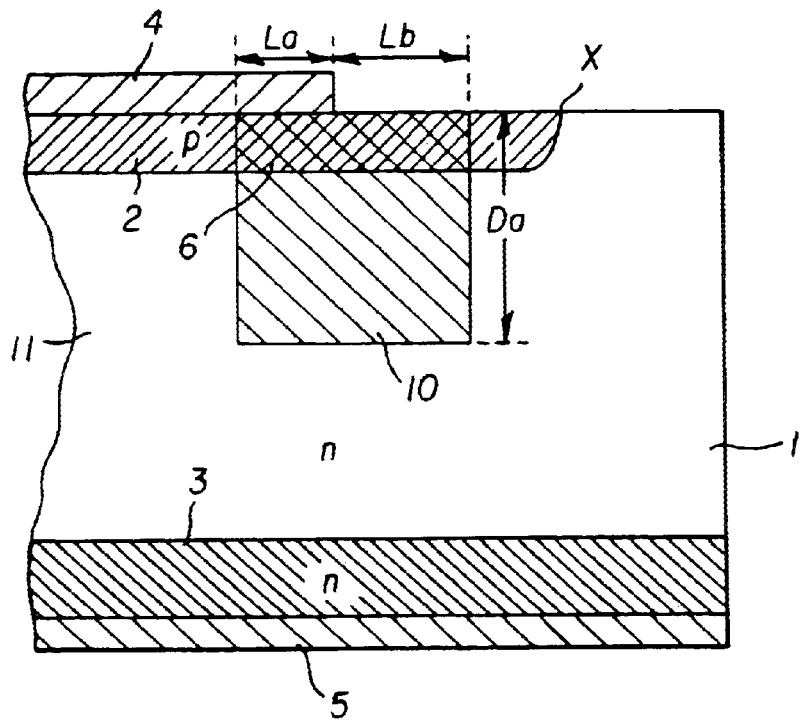
FIG. 7 is a cross sectional view of a p-i-n diode according to a second embodiment of the invention.

FIG. 7 is a cross sectional view of a p-i-n diode according to this second embodiment of the invention that includes a first carrier lifetime region 10 (in which the carrier lifetime is short) in a location of the semiconductor substrate different from the location of the first carrier lifetime region shown in FIG. 1.

In the diode structure shown in FIG. 7, the edge area of a p-type anode layer 2 and the edge area of an anode electrode 4 are spaced apart about 300 micrometers from each other. First carrier lifetime region 10 (in which the carrier lifetime is short) is formed in such a way that first carrier lifetime region 10 does not include the edge area X of p-type anode layer (p-type well region) 2; extends across the edge area of anode (drain) electrode 4, which p-type anode layer 2 is in contact with; and includes a boundary area 6 (i.e., the contact area of p-type anode layer 2 and the lightly doped semiconductor layer). The lightly doped semiconductor layer corresponds to a second carrier lifetime region 11 (in which the carrier lifetime is long). Hereinafter, the lightly doped semiconductor layer will be referred to as the "semiconductor layer 11".

By forming first carrier lifetime region 10 in the portion below the electrode edge area, current localization in the vicinity of the electrode edge area is prevented from occurring when a reverse bias voltage is applied. Accordingly, the reverse-recovery withstanding capability (or the turn-off withstanding capability) is significantly improved.

Figure 8:
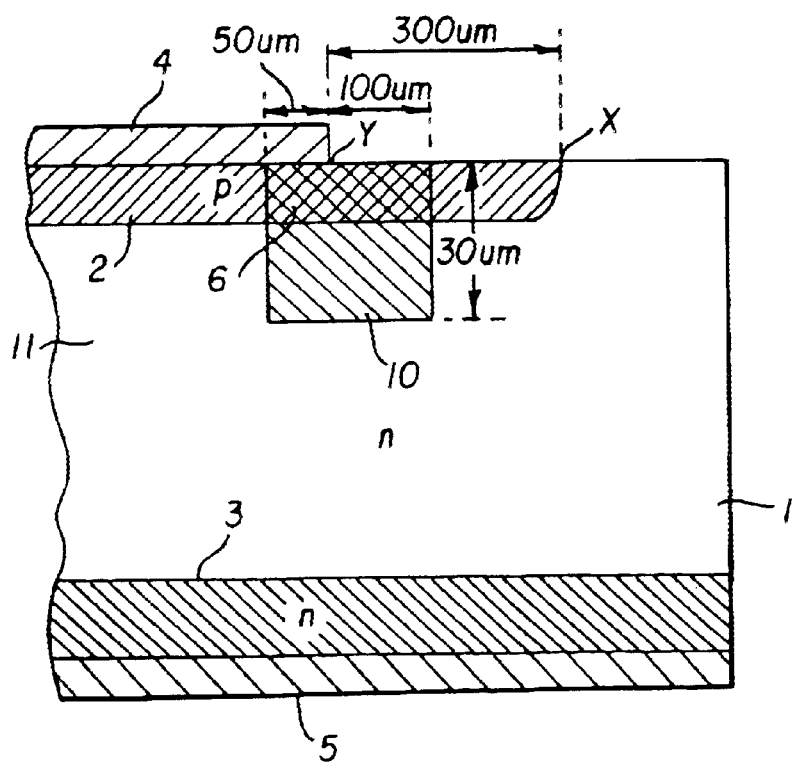
FIG. 8 is a cross sectional view describing the practical structural parameters of the p-i-n diode according to the second embodiment.
Figure 9:
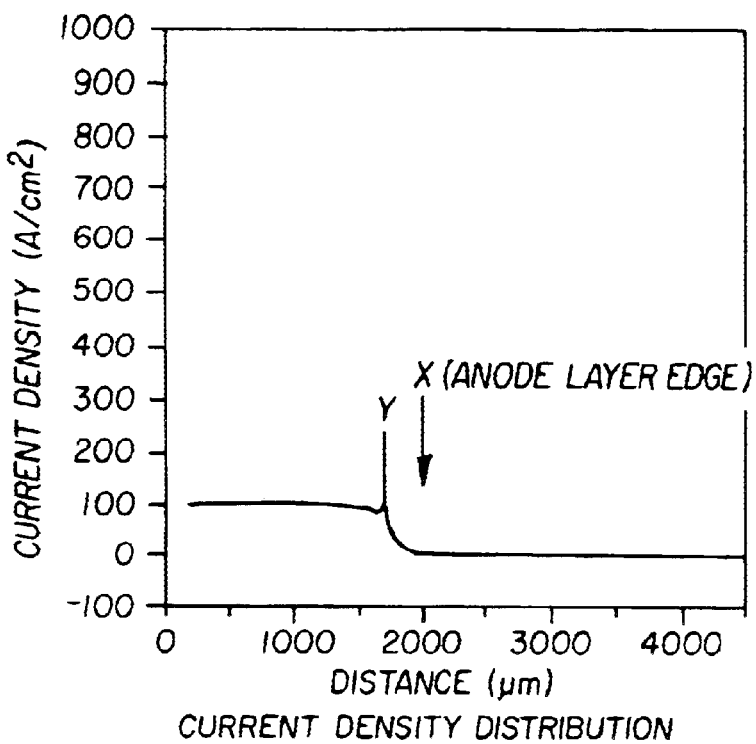
FIG. 9 is a graph showing the simulated current density distribution in the vicinity of the pn-junction of the p-i-n diode shown in FIG. 8.

Investigations conducted on the p-i-n diode according to the second embodiment will now be described with reference to FIGS. 8 and 9. FIG. 8 is a cross sectional view describing the practical structural parameters of a p-i-n diode according to the second embodiment. FIG. 9 is a graph showing the simulated current density distribution in the vicinity of the pn-junction of the p-i-n diode shown in FIG. 8, to which $He^{2+}$ ion irradiation is applied.

Specifically, in FIG. 8, the edge area X of p-type anode layer 2 is preferably located at the distance of about 2000 micrometers. The contact area Y (i.e., the boundary area 6), at which anode electrode 4 contacts p-type anode layer 2, is located at the distance of about 1700 micrometers. In this second embodiment, first carrier lifetime region 10 does not include the edge area X of p-type anode layer 2, and extends across the electrode edge area. First carrier lifetime region 10 is formed only in the contact area Y, in which anode electrode 4 contacts p-type anode layer 2.

As the current density distribution described in FIG. 9 indicates, the current localization in the vicinity of the edge of the anode electrode is relaxed by shortening the carrier lifetime in the contact area Y, where anode electrode 4 comes into contact with p-type anode layer 2.

Comparative Examples

Figure 10:
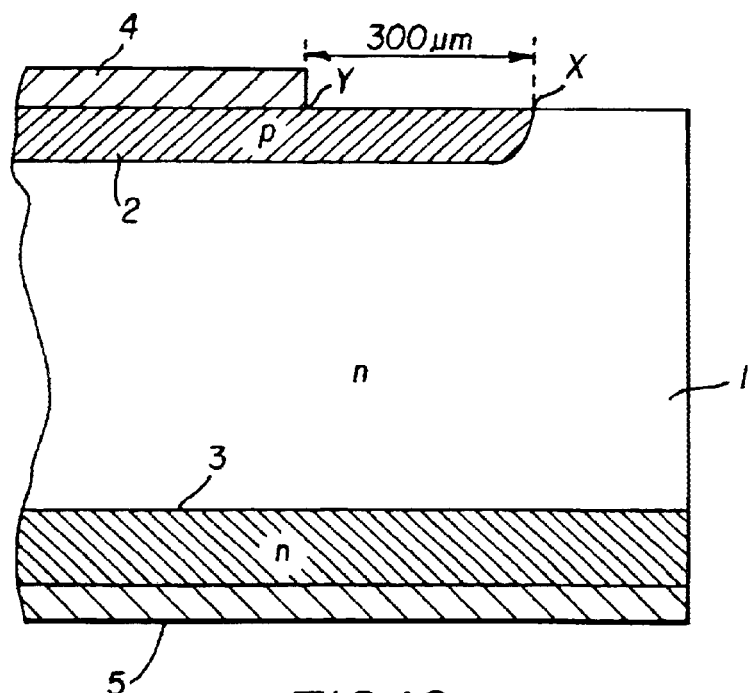
FIG. 10 is a cross sectional view of a comparative diode structure.
Figure 11:
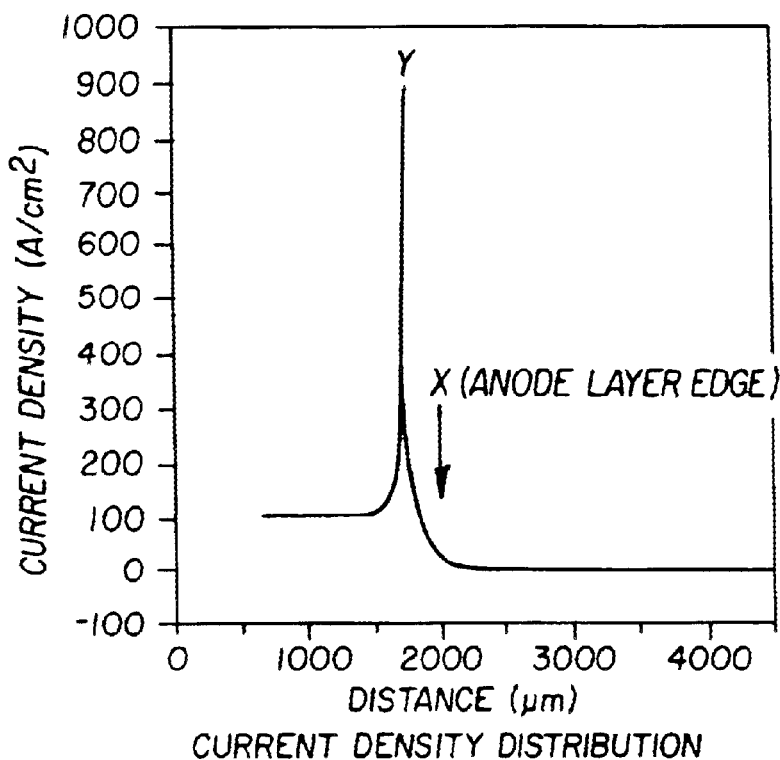
FIG. 11 is a graph describing the current density distribution in the comparative diode structure of FIG. 10.

Comparative diode structures formed for the sake of comparison will now be described with reference to FIGS. 10 through 13. FIG. 10 is a cross sectional view of a comparative diode structure, and FIG. 11 is a graph describing the current density distribution in the comparative diode structure of FIG. 10. In FIG. 11, the edge area X is preferably positioned at a distance of about 2000 micrometers, and the contact area Y is positioned at the distance of about 1700 micrometers, in the same way as in FIG. 9.

As described in FIG. 11, the current density localizes, not in the edge area X of p-type anode layer 2 but in the contact area Y, in which anode electrode 4 comes in contact with p-type anode layer 2. Therefore, the comparative diode structure does not effectively relax current localization.

Figure 12:
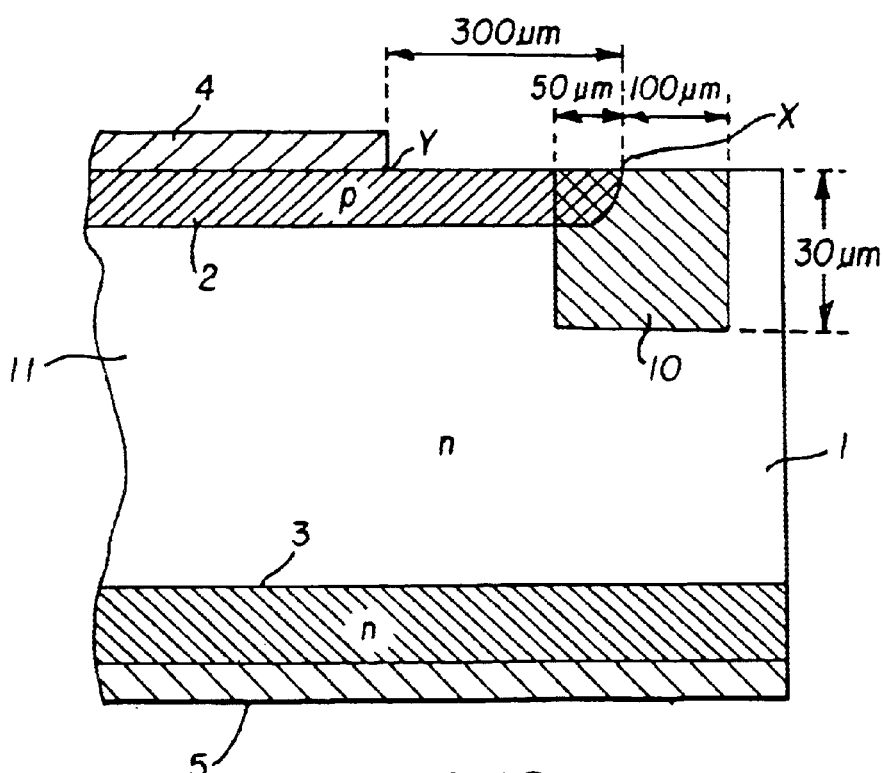
FIG. 12 is a cross sectional view of another comparative diode structure.
Figure 13:
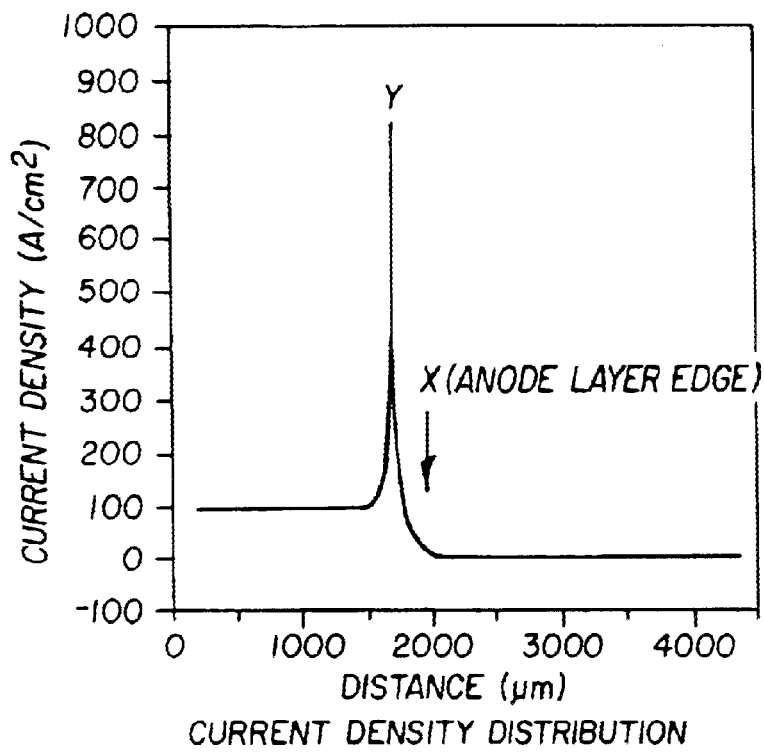
FIG. 13 is a graph describing the current density distribution in the comparative diode structure of FIG. 12.

FIG. 12 is a cross sectional view of another comparative diode structure, in which first carrier lifetime region 10 (in which the carrier lifetime is short) is formed, not below the anode electrode, but in the edge area X of the p-type anode region. FIG. 13 is a graph describing the current density distribution in the comparative diode structure of FIG. 12.

In the diode structure shown in FIG. 12, the current density localizes in the contact area Y in the same way as shown in the diode structure of FIG. 10. Therefore, the diode structure shown in FIG. 12 is not significantly effective relaxing current localization.

Third Embodiment of the Invention

Figure 14:
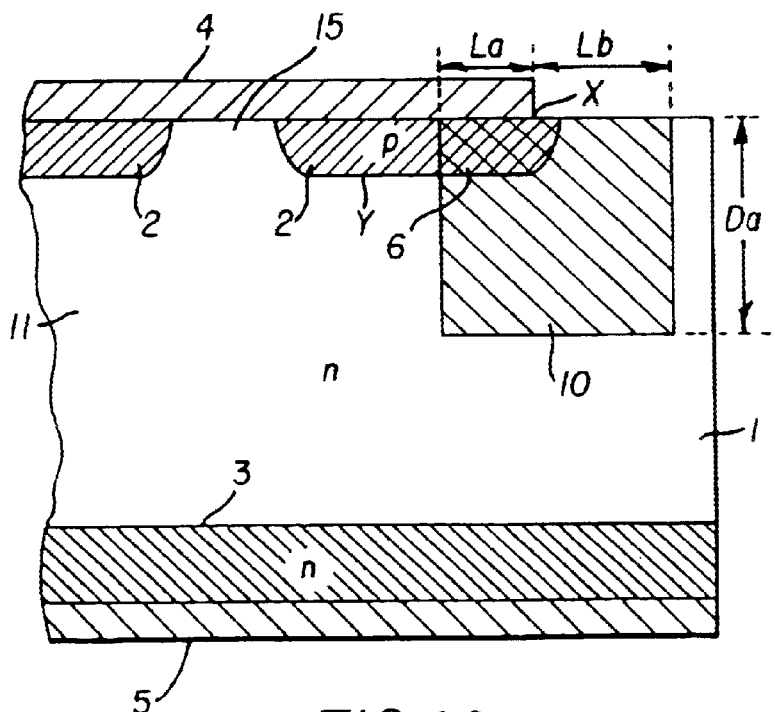
FIG. 14 shows a cross sectional view of a p-i-n diode according to a third embodiment of the invention.

A third preferred embodiment of the invention will now be described with reference to FIG. 14, which shows a cross sectional view of a p-i-n diode. Referring to FIG. 14, the diode according to this third embodiment includes a non-contact region 15 between two separate p-type anode regions 2 and 2.

A first carrier lifetime region 10 (in which the carrier lifetime is short) is formed in the same way as in the diode of FIG. 1, such that first carrier lifetime region 10 extends across the edge area X of anode electrode 4 and includes boundary area 6, where p-type anode layer 2 and lightly doped semiconductor layer 11 contact each other. By forming first carrier lifetime region 10 (in which the carrier lifetime is short) in such a configuration that first carrier lifetime region 10 extends across the edge area X of anode electrode 4 and includes the boundary area 6, current localization in the vicinity of the electrode edge area is prevented from occurring. Further, the reverse-recovery withstanding capability (or the turn-off withstanding capability) is significantly improved. Since region 10 (which is an irradiated region and in which the carrier life time is short) is a part of the operating (active) region, the increase in the forward voltage (on-voltage) is almost negligible.

Fourth Embodiment of the Invention

Figure 15:
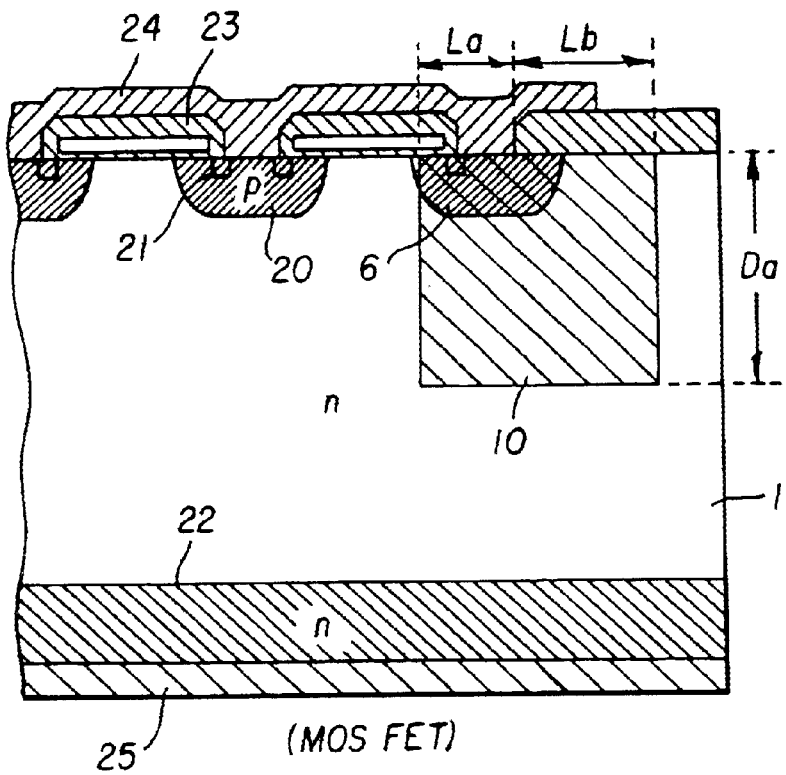
FIG. 15 shows a cross sectional view of a metal oxide-film semiconductor field effect transistor (MOSFET) according to a fourth embodiment of the invention.

The invention will now be described further with reference to FIG. 15, which shows a cross sectional view of a metal oxide-film semiconductor field effect transistor (MOSFET) according to a fourth preferred embodiment of the invention. In FIG. 15, a p-type well region 20, an n-type source region 21, an n-type drain region 22, an oxide film 23, a source electrode 24, and a drain electrode 25 are shown. A first carrier lifetime region 10 (in which the carrier lifetime is short) extends across the edge area of source electrode 24 and includes a boundary area 6, where p-type well region 20 contacts lightly doped semiconductor layer 11.

By forming first carrier lifetime region 10 (in which the carrier lifetime is short) in such a configuration that first carrier lifetime region 10 extends across the edge area of source electrode 24 and includes boundary area 6, current localization in the vicinity of the electrode edge area is prevented from occurring, and the reverse-recovery withstanding capability (or the turn-off withstanding capability) is significantly improved. Since region 10 (which is an irradiated region and in which the carrier life time is short) is a part of the operating (active) region, the increase in the forward voltage (on-voltage) is almost negligible.

Fifth Embodiment of the Invention

Figure 16:
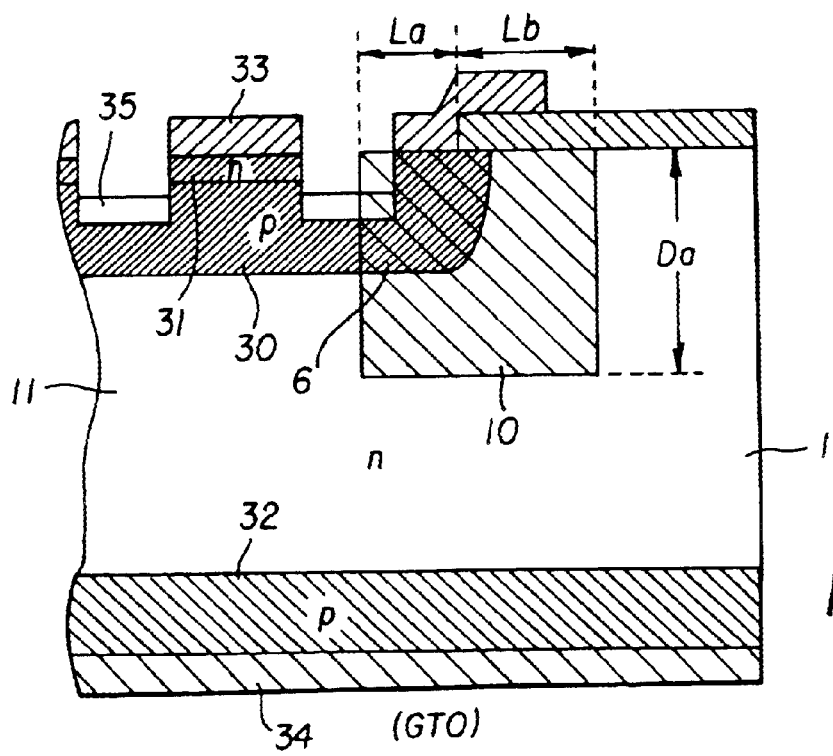
FIG. 16 shows a cross sectional view of a gate turnoff thyristor (GTO) according to a fifth embodiment of the invention.
Figure 17:
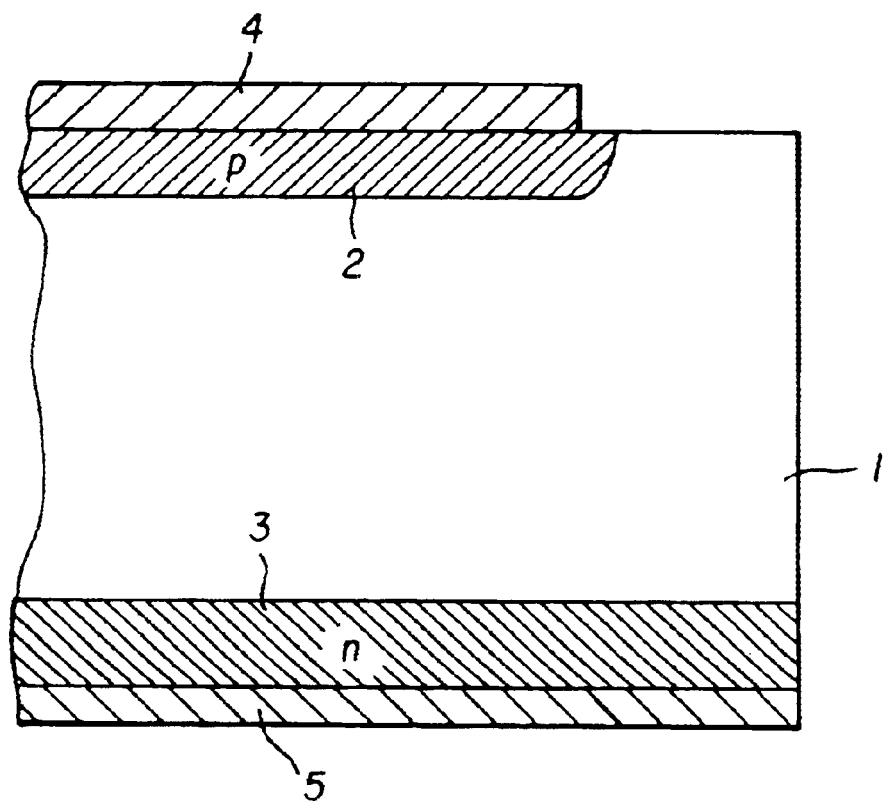
FIG. 17 is a cross sectional view of a conventional fundamental p-i-n diode.

The invention will now be described further with reference to FIG. 16, which shows a cross sectional view of a gate turnoff thyristor (GTO) according to a fifth preferred embodiment of the invention. In FIG. 16, a p-type base region 30, an n-type cathode region 31, a p-type anode layer 32, a cathode electrode 33, an anode electrode 34, and a gate electrode 35 are shown. A first carrier lifetime region 10 (in which the carrier lifetime is short) extends across the edge area of cathode electrode 33 and includes a boundary area 6, where a p-type base region 30 contacts a lightly doped semiconductor layer 11.

By forming first carrier lifetime region 10 (in which the carrier lifetime is short) in such a configuration that first carrier lifetime region 10 extends across the edge area of cathode electrode 33 and includes boundary area 6, current localization in the vicinity of the electrode edge area is prevented from occurring, and the reverse-recovery withstanding capability (or the turn-off withstanding capability) is improved. Since region 10 (which is an irradiated region and in that the carrier life time is short) is a part of the operating (active) region, the increase in forward voltage (on-voltage) is almost negligible.

The invention has been described thus far in connection with semiconductor structures including a means to adjust the carrier lifetime between electrodes arranged on respective major surfaces of a semiconductor substrate and facing opposite to each other. However, the invention is also effectively applicable to semiconductor structures in which the main electrodes are formed on a single major surface.

Effects of the Invention

As explained above, current localization in the vicinity of the electrode edge area is prevented from occurring and the reverse-recovery withstanding capability (or the turn-off withstanding capability) is improved by forming regulation regions having different carrier lifetimes in such a configuration that one regulation region (in which the carrier lifetime is short) extends across an edge area of an electrode projection that projects the electrode vertically into a semiconductor substrate and includes the boundary area spreading almost vertically between a heavily doped region of a second conductivity type and a lightly doped region of a first conductivity type.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor substrate of a lightly doped first conductivity type;
   a heavily doped region of a second conductivity type formed selectively in the semiconductor substrate; and
   an electrode formed on a surface of said semiconductor substrate, said electrode being in contact with said heavily doped region, said heavily doped region having a projecting region that extends beyond said electrode,
   wherein said semiconductor substrate comprises a first carrier lifetime region and a second carrier lifetime region,
   wherein the carrier lifetime in said first carrier lifetime region is shorter than the carrier lifetime of said second carrier lifetime region,
   wherein said first carrier lifetime region extends into at least a portion of said projection region of said heavily doped region and overlaps a portion of said electrode, and wherein said first carrier lifetime region includes a boundary area spreading nearly vertically between said heavily doped region and said semiconductor substrate, wherein said first carrier lifetime region has a portion having a width La that overlaps said electrode, the width La and a diffusion length Ls of carriers in said first carrier lifetime region are related to each other by the following relational expression: La>Ls.

2. The semiconductor device according to claim 1, wherein said first carrier lifetime region extends below across an outermost edge area of said electrode to adjacent to an edge area of the semiconductor device.

3. The semiconductor device according to claim 1, wherein said electrode is formed on a surface of said semiconductor substrate and said first carrier lifetime region extends perpendicularly to said surface.

4. The semiconductor device according to claim 1, wherein:
   a. the depth Da of said first carrier lifetime region measured from the surface of said semiconductor substrate on which said heavily doped region is formed,
   b. the diffusion length Ls of carriers in said first carrier lifetime region, and
   c. the depth Xj of the pn-junction between said heavily doped region and said semiconductor substrate,
   are all related to each other by the following relational expression: Da>Ls+Xj.

5. The semiconductor device according to claim 1, wherein the carrier lifetime in said first carrier lifetime region is ⅓ or less of the carrier lifetime in said second carrier lifetime region.

6. The semiconductor device according to claim 1, wherein the semiconductor device is a diode, said heavily doped region is an anode layer, and said electrode is an anode electrode.

7. The semiconductor device according to claim 1, wherein said boundary area of said first carrier lifetime region extends from the surface of the substrate to a depth less than a thickness of the semiconductor substrate.

8. A semiconductor device comprising:
   a semiconductor substrate of a lightly doped first conductivity type;
   a heavily doped region of a second conductivity type formed selectively in the semiconductor substrate; and
   an electrode formed on a surface of said semiconductor substrate, said electrode being in contact with said heavily doped region, said heavily doped region having a projecting region that extends beyond said electrode,
   wherein said semiconductor substrate comprises a first carrier lifetime region and a second carrier lifetime region,
   wherein the carrier lifetime in said first carrier lifetime region is shorter than the carrier lifetime of said second carrier lifetime region,
   wherein said first carrier lifetime region extends into at least a portion of said projection region of said heavily doped region and overlaps a portion of said electrode, and
   wherein said first carrier lifetime region includes a boundary area spreading nearly vertically between said heavily doped region and said semiconductor substrate, and
   wherein said first carrier lifetime region has a portion having a width Lb that does not overlap said electrode, the width Lb and a diffusion length Lh of carriers in said second carrier lifetime region are related to each other by the following relational expression: Lb>Lh.

9. The semiconductor device according to claim 8, wherein said first carrier lifetime region extends below across an outermost edge area of said electrode to adjacent to an edge area of the semiconductor device.

10. The semiconductor device according to claim 8, wherein said electrode is formed on a surface of said semiconductor substrate and said first carrier lifetime region extends perpendicularly to said surface.

11. The semiconductor device according to claim 8, wherein:
   a. the depth Da of said first carrier lifetime region measured from the surface of said semiconductor substrate on which said heavily doped region is formed,
   b. the diffusion length Ls of carriers in said first carrier lifetime region, and
   c. the depth Xj of the pn-junction between said heavily doped region and said semiconductor substrate,
   are all related to each other by the following relational expression: Da>Ls+Xj.

12. The semiconductor device according to claim 8, wherein the carrier lifetime in said first carrier lifetime region is ⅓ or less of the carrier lifetime in said second carrier lifetime region.

13. The semiconductor device according to claim 8, wherein the semiconductor device is a diode, said heavily do region is an anode layer, and said electrode is an anode electrode.

14. The semiconductor device according to claim 8, wherein said boundary area of said first carrier lifetime region extends from the surface of the substrate to a depth less than a thickness of the semiconductor substrate.

15. A method of manufacturing a semiconductor device comprising the steps of:
   providing a semiconductor substrate of a lightly doped first conductivity type;
   forming a heavily doped region of a second conductivity type selectively in the semiconductor substrate; and
   forming an electrode on a surface of said semiconductor substrate, said electrode being in contact with said heavily doped region, said heavily doped region having a projection region that extends beyond said electrode,
   wherein said semiconductor substrate comprises a first carrier lifetime region and a second carder lifetime region, wherein the carrier lifetime in said first carrier lifetime region is shorter than the carrier lifetime of said second carrier lifetime region,
   wherein said first carrier lifetime region extends into at least a portion of said projection region of said heavily doped region and overlaps a portion of said electrode,
   wherein said first carrier lifetime region includes a boundary area spreading nearly vertically between said heavily doped region and said semiconductor substrate,
   wherein said first carrier lifetime region has a portion having a width La that overlaps said electrode, the width La and a diffusion length Ls of carriers in said first carrier lifetime region are related to each other by the following relational expression: La>Ls, and
   wherein said first carrier lifetime region is formed by irradiating said semiconductor substrate with a particle beam.

16. The method according to claim 15, wherein the particle beam is irradiated onto the surface of said semiconductor substrate on the same side on which said electrode is formed.

17. The method according to claim 15, wherein the particle beam comprises He$^{2+}$ ions or protons.

18. The method according to claim 17, wherein He$^{2+}$ ions are irradiated at the amount of dose of $1\times10^{10}$ cm$^{-2}$ or more.

19. The method according to claim 15, wherein the carrier lifetime in said first carrier lifetime region is ⅓ or less of the carrier lifetime in second carrier lifetime region.

20. The method according to claim 15, wherein the semiconductor device is a diode, said heavily doped region of the second conductivity type is an anode layer, and said electrode is an anode electrode.

21. The method according to claim 15, wherein said boundary area of said first carrier lifetime region extends from the surface of the substrate to a depth less than a thickness of the semiconductor substrate.

22. A method of manufacturing a semiconductor device comprising the steps of:

providing a semiconductor substrate of a lightly doped first conductivity type;

forming a heavily doped region of a second conductivity type selectively in the semiconductor substrate; and forming an electrode on a surface of said semiconductor substrate, said electrode being in contact with said heavily doped region, said heavily doped region having a projecting region that extends beyond said electrode, wherein said semiconductor substrate comprises a first carrier lifetime region and a second carrier lifetime region, wherein the carrier lifetime in said first carrier lifetime region is, shorter than the carrier lifetime of said second carrier lifetime region, wherein said first carrier lifetime region extends into at least a portion of said projection region of said heavily doped region and overlaps a portion of said electrode, wherein said first carrier lifetime region includes a boundary area spreading nearly vertically between said heavily doped region and said semiconductor substrate, wherein said first carrier lifetime region has a portion having a width Lb that does not overlap said electrode, the width Lb and a diffusion length Lh of carriers in said second carrier lifetime region are related to each other by the following relational expression: Lb>Lh, and wherein said first carrier lifetime region is formed by irradiating said semiconductor substrate with a particle beam.

23. The method according to claim 22, wherein the particle beam is irradiated onto the surface of said semiconductor substrate on the same side on which said electrode is formed.

24. The method according to claim 22, wherein the particle beam comprises He$^{2+}$ ions or protons.

25. The method according to claim 24, wherein He$^{2+}$ ions are irradiated at the amount of dose of $1\times10^{10}$ cm$^{-2}$ or more.

26. The method according to claim 22, wherein the carrier lifetime in said first carrier lifetime region is ⅓ or less of the carrier lifetime in said second carrier lifetime region.

27. The method according to claim 22, wherein the semiconductor device is a diode, said heavily doped region of the second conductivity type is an anode layer, and said electrode is an anode electrode.

28. The method according to claim 22, wherein said boundary area of said first carrier lifetime region extends from the surface of the substrate to a depth less than a thickness of the semiconductor substrate.

* * * * *